(12) United States Patent
De Sandre et al.

(10) Patent No.: US 8,797,092 B2
(45) Date of Patent: Aug. 5, 2014

(54) DISCHARGE CIRCUIT FOR VOLTAGE MULTIPLIERS

(75) Inventors: Guido De Sandre, Brugherio (IT); Luca Bettini, Zurich (CH); Gianni Giacomi, Verona (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 96 days.

(21) Appl. No.: 13/222,775

(22) Filed: Aug. 31, 2011

(65) Prior Publication Data

US 2012/0075010 A1    Mar. 29, 2012

(30) Foreign Application Priority Data

Aug. 31, 2010   (IT) .......................... MI2010A001588

(51) Int. Cl.
*H03K 3/01*    (2006.01)
*G05F 1/10*    (2006.01)

(52) U.S. Cl.
USPC ........................... 327/538; 327/536; 327/589

(58) Field of Classification Search
USPC ......................................... 327/534–540, 589
See application file for complete search history.

(56) References Cited

U.S. PATENT DOCUMENTS

| | | | |
|---|---|---|---|
| 5,321,313 A * | 6/1994 | Oberhauser | 327/432 |
| 5,537,072 A | 7/1996 | Canclini | |
| 5,781,048 A * | 7/1998 | Nakao et al. | 327/157 |
| 6,661,683 B2 * | 12/2003 | Botker et al. | 363/60 |
| 7,049,801 B2 * | 5/2006 | Kuo | 323/288 |
| 7,142,041 B2 | 11/2006 | Somerville | |
| 7,345,946 B1 * | 3/2008 | Chapman et al. | 365/230.06 |
| 8,054,125 B2 * | 11/2011 | Nervegna | 327/536 |
| 2003/0174010 A1 | 9/2003 | Pappalardo et al. | |
| 2007/0182499 A1 * | 8/2007 | Wakai et al. | 331/135 |

FOREIGN PATENT DOCUMENTS

EP    1635444    3/2006

OTHER PUBLICATIONS

Search Report for Italian Application No. MI20101588, Ministero dello Sviluppo Economico, Munich, Apr. 15, 2011, pp. 2.

* cited by examiner

*Primary Examiner* — Dinh T. Le
(74) *Attorney, Agent, or Firm* — Graybeal Jackson LLP

(57) ABSTRACT

An embodiment of a discharge circuit for evacuating electric charge accumulated in circuit nodes of a charge pump during a discharge phase consequent to a shutdown of the charge pump is proposed. The charge pump is configured to bias each circuit node with a corresponding pump voltage during an operational phase of the charge pump. The discharge circuit includes a generator circuit configured to generate a discharge current during the discharge phase. The discharge circuit further includes means for evacuating the electric charge stored in each circuit node of the charge pump during a corresponding portion of the discharge phase; such means for evacuating include a respective discharge stage for each circuit node of the charge pump. Each discharge stage includes a first discharge circuit branch and a second discharge circuit branch coupled to the corresponding circuit node. The discharge stage is configured to cause the discharge current flowing through the first discharge circuit branch—during the portion of the discharge phase of the corresponding circuit node—when the pump voltage of the corresponding circuit node is higher than a respective threshold, and through the second discharge circuit branch when the pump voltage of the corresponding circuit node is lower than said respective threshold.

39 Claims, 7 Drawing Sheets

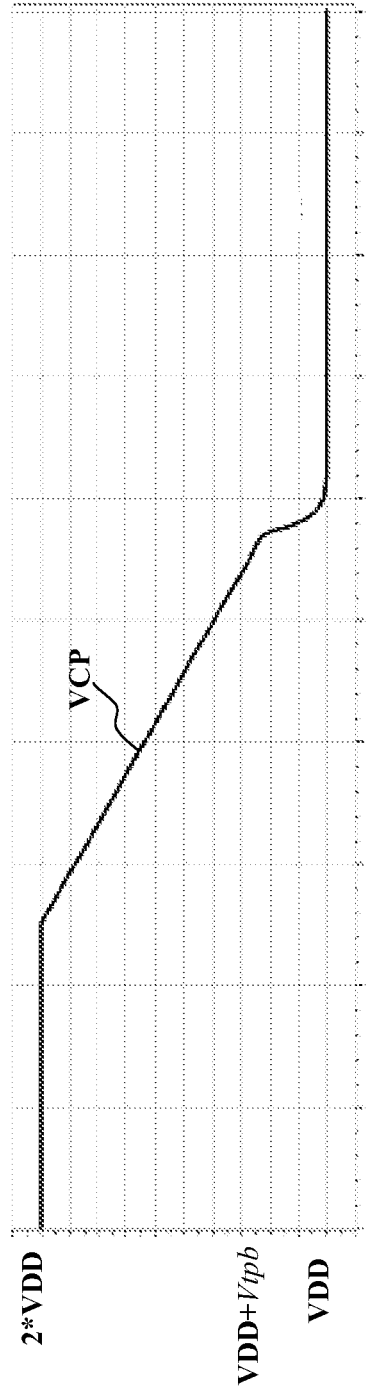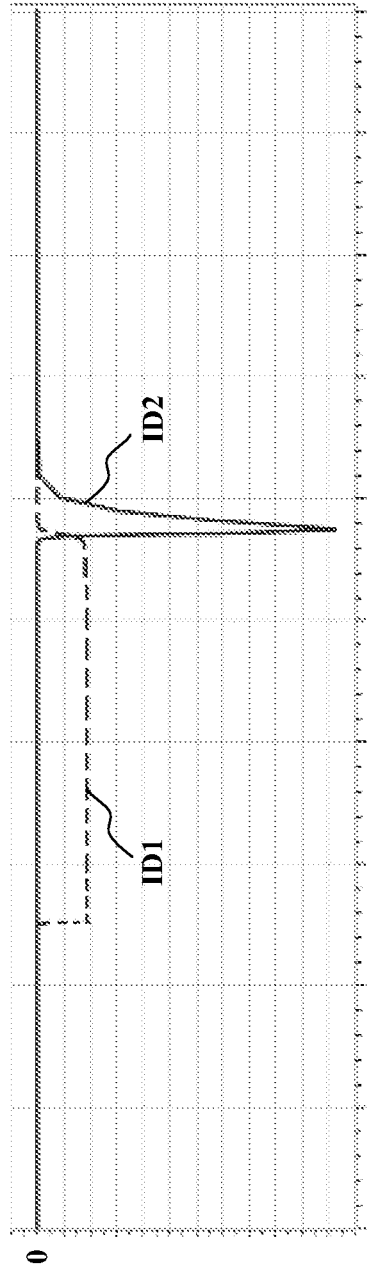

DISCHARGE CIRCUIT FOR VOLTAGE MULTIPLIERS

PRIORITY CLAIM

The instant application claims priority to Italian Patent Application No. MI2010A001588, filed Aug. 31, 2010, which application is incorporated herein by reference in its entirety.

TECHNICAL FIELD

An embodiment relates to the field of voltage multipliers of the charge pump type. In particular, an embodiment relates to a system for discharging the output of a charge pump voltage multiplier.

BACKGROUND

The current widespread use of portable electronic devices such as mobile phones, PDAs, and portable computers, including a plurality of embedded systems powered by batteries, has directed research towards solutions that enable an even greater reduction in power consumption, in order to prolong the operational functioning of such devices before their batteries need to be recharged or replaced.

To achieve this goal, for a long time a technological process has been initiated for reducing the operating voltages (voltage scaling) of the components included in portable electronic devices, making it possible to develop systems with low power consumption.

However, due to certain operational specifications, it may not be possible to reduce the operating voltage of some of the electronic systems included in a portable electronic device, such as, for example, the memories of the EEPROM and FLASH types, which typically use voltages values higher than the voltage value that supplies the portable electronic device in which they are disposed in order to correctly carry out write and erase operations.

Integrated circuits called voltage multipliers have been made to resolve this issue. A voltage multiplier is a circuit that is able to generate voltages of a value higher than the supply voltage. The currently most used type of voltage multiplier is a charge pump. The charge pump voltage multipliers, or more simply charge pumps, are formed by a plurality of cascaded multiplication stages, each including a corresponding pumping capacitor. The operation of a charge pump is based on the accumulation and transfer of charge in the sequence of pumping capacitors, which are intercoupled to each other via corresponding switching elements, such as MOS transistors or diodes. In particular, each pumping capacitor has a free terminal, which is controlled by a signal that switches between a low voltage and a high voltage; the control signals of adjacent pumping capacitors are always in counter phase. In this way, when the control signal is the at low voltage value, the pumping capacitor is charged by the preceding pumping capacitor; when the control signal switches to the high voltage value, the stored charge is transferred to the following pumping capacitor.

Once a voltage multiplication operation is ended, the electric charge stored on the plates of the capacitors (which may reach very high levels) is discharged in order to avoid damaging the electronic components directly or indirectly supplied by the charge pump, as well as to avoid damaging the capacitors themselves and the switching elements of the charge pump.

Several solutions have been proposed for discharging the capacitors of charge pumps in a controlled manner. A simple proposed solution includes a single transistor controlled by a signal for enabling/disabling the charge pump. The assertion of the enabling/disabling signal causes the activation of the transistor, allowing the capacitors to discharge through a path towards a terminal at a lower voltage (typically, the supply voltage or the ground reference voltage of the system). Such a solution uses a transistors able to withstand high voltage differences (higher than the supply voltage of the system) between their terminals. Therefore, such transistors may require a dedicated production process (not always available) to be manufactured, thereby increasing the overall cost of the system.

Another known solution differs from the previous one since it provides for using a transistor that operates with reduced voltage differences (i.e. between the ground voltage and the supply voltage), and driving such transistor with a suitable level shifter circuit. This solution has the disadvantage of not fully discharging the charge pump because the transistor requires a minimum value for the overdrive voltage (i.e. the difference between the gate-source voltage and threshold voltage of the transistor) in order to remain active.

Another solution, disclosed in U.S. Pat. No. 5,537,072, which is incorporated by reference, proposes a switching circuit for a charge pump. The switching circuit has a first transistor for conducting a current and is controlled by a second, third, and fourth transistor. The second transistor protects the first transistor from an excessive voltage between the gate and drain terminals. The third transistor receives a signal for switching the switching circuit and serves as a cascode transistor to protect the fourth transistor from an excessive voltage between the gate and drain terminals. Consequently, the switching circuit may withstand high voltage values between the gate and drain terminals and may have an improved reliability. The switching circuit also has a shutdown circuit for facilitating the shutdown of the charge on the control element of the first transistor. The switching circuit also has a zener diode to prevent an excessive voltage from being applied between the gate and drain terminals of the first transistor.

Another known solution is described in U.S. Pat. No. 7,142,041, which is incorporated by reference and which describes a circuit and a method to shutdown a charge pump having any number of stages. The shutdown may be performed either until all the stages reach a null voltage or until all stages have the initial input voltage level. The shutdown is performed in a modular fashion, proceeding backwards from the output until reaching the input, so that the charge sharing among the capacitors is in such a way that no voltage exceeds its range of operation. An additional advantage of this solution is that the charge pump may be turned on before the shutdown sequence is completed, with all the internal and external nodes of the charge pump remaining within their normal range of operation.

SUMMARY

It has been observed that at least some discharge circuits for charge pumps known in the art do not appear to be satisfactory, since they require opposite devices to support the high value of the voltages provided by the charge pump and complex control logic.

An embodiment is a new discharge circuit. The discharge circuit evacuates electric charge accumulated in circuit nodes of a charge pump during a discharge phase consequently to a shutdown of the charge pump. The charge pump is configured to bias each circuit node with a corresponding pump voltage during an operational phase of the charge pump. The discharge circuit includes a generator circuit configured to generate a discharge current during the discharge phase. The discharge circuit further includes means for evacuating the electric charge stored in each circuit node of the charge pump during a corresponding portion of the discharge phase; such means for evacuating include a respective discharge stage for each circuit node of the charge pump. Each discharge stage includes a first discharge circuit branch and a second discharge circuit branch coupled to the corresponding circuit node. The discharge stage is configured to cause the discharge current flowing through the first discharge circuit branch during the portion of the discharge phase of the corresponding circuit node when the pump voltage of the corresponding circuit node is higher than a respective threshold, and through the second discharge circuit branch when the pump voltage of the corresponding circuit node is lower than said respective threshold.

Another embodiment is a method for evacuating the electric charge stored in the circuit nodes of a charge pump.

BRIEF DESCRIPTION OF THE DRAWINGS

One or more embodiments, as well as features and advantages thereof, are better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is understood that the figures are not necessarily drawn to scale (with some details that may be exaggerated and/or simplified) and that, unless otherwise specified, they are simply intended to conceptually illustrate the structures and procedures described herein. In particular:

FIGS. 2A and 2B are plots of the trend of an output voltage of a charge pump and the trend of the currents in the circuit of FIG. 1, respectively, during an exemplificative discharge operation;

DETAILED DESCRIPTION

Figure 1:
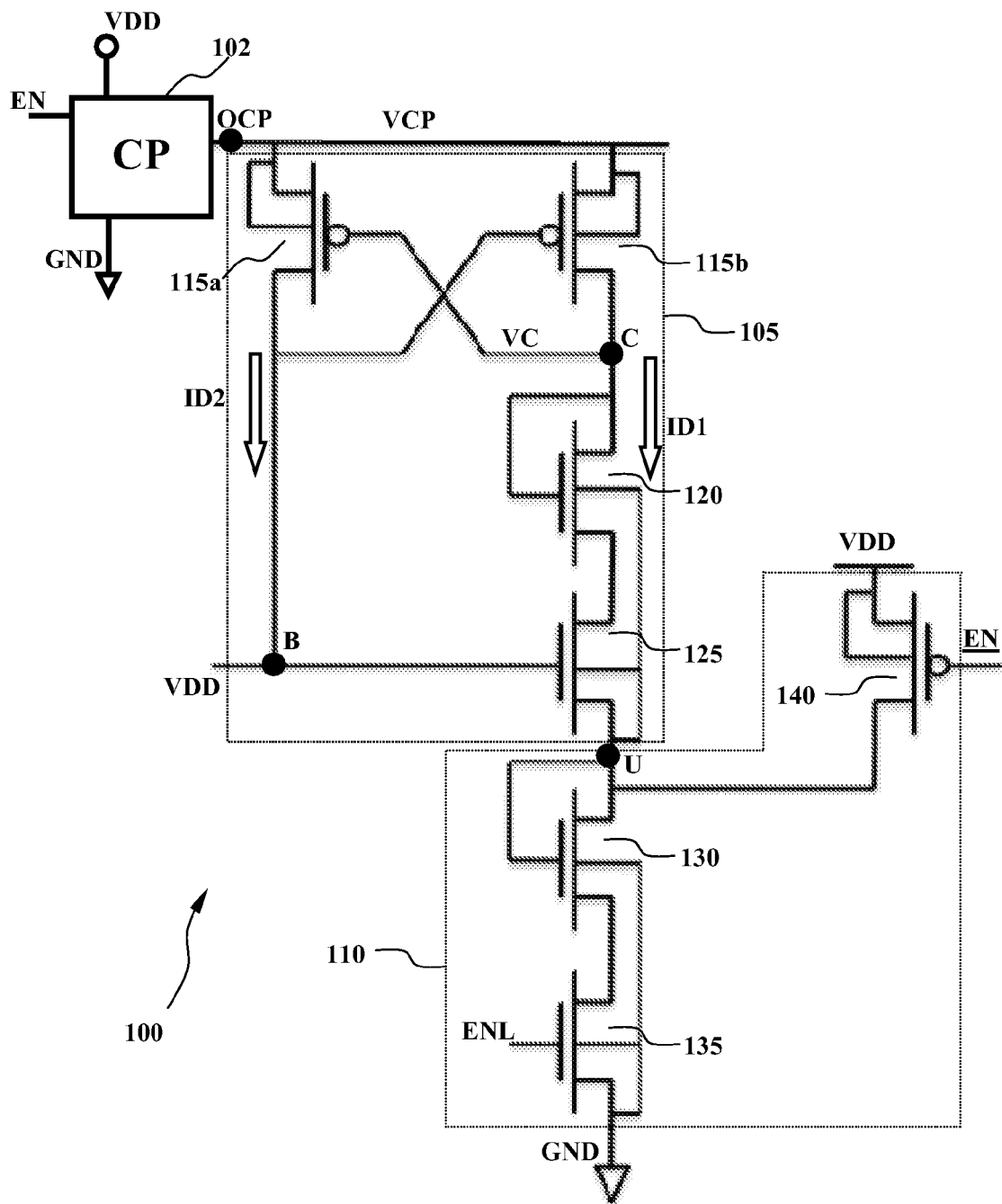
FIG. 1 is a schematic diagram of a discharge circuit according to an embodiment.

With reference to the drawings, FIG. 1 is a schematic diagram of a discharge circuit 100 according to an embodiment. The discharge circuit 100 is adapted to discharge an output terminal OCP of a charge pump 102 adapted to generate an output voltage VCP from a supply voltage VDD, in particular, in an embodiment, the output voltage VCP generated by the charge pump is such to have (ideally, without load) a value corresponding to twice the value of the supply voltage VDD. The charge pump receives a pump enable signal EN whose value determines whether the charge pump is active or not; for example, when the enable signal EN is at the value of the supply voltage VDD the charge pump 102 is active, whereas when the enable signal EN is at the value of the ground voltage, the charge pump is inactive.

The discharge circuit 100 includes an upper module 105 and a lower module 110 coupled together.

The upper module 105 includes a P-channel transistor 115a coupled to the output terminal OCP of the charge pump by means of a first conduction or source terminal. A second conduction or drain terminal of the transistor 115a is coupled to a terminal B to receive the supply voltage VDD. A control terminal or gate of the transistor 115a is coupled to a drain terminal of a P-channel transistor 115b (circuit node C). A source terminal of the transistor 115b is coupled to the output terminal OCP, while a gate terminal is coupled to terminal B. The upper module 105 also includes an N-channel transistor 120 having a drain terminal and a gate terminal coupled to node C, and a source terminal coupled to a drain terminal of a further N channel transistor 125. The transistor 125 has a gate terminal coupled to the terminal B and a source terminal that serves as output terminal of the upper module 105. Moreover, in order to reduce the body effect, the substrate or body terminals of the transistors 115a and 115b are coupled to the output terminal OCP, while the body terminals of the transistors 120 and 125 are coupled to the source terminal of the transistor 125.

The lower module 110 includes an N-channel transistor 130 having a drain terminal that serves as input terminal of the lower module 110. A gate terminal of the transistor 130 is coupled to the drain terminal thereof, while a source terminal is coupled to a drain terminal of an N-channel transistor 135. The transistor 135 has a source terminal coupled to a reference terminal GND for receiving a reference or ground voltage, and a gate terminal for receiving an enable signal ENL; as will become clearer below, such enable signal ENL has a voltage which may alternatively take the ground voltage value and a value equal to a fraction of the supply voltage VDD. The lower module 110 also includes a P-channel transistor 140 having a source terminal coupled to a power supply terminal for receiving the supply voltage VDD, a drain terminal coupled to the drain terminal of the transistor 130 and a gate terminal for receiving a disabling signal EN, corresponding to the complement of the pump enable signal EN. Moreover, again in order to reduce the body effect, a body terminal of the transistor 140 is coupled to its source terminal, while the body terminals of the transistors 130 and 135 are coupled to the source terminal of the transistor 135.

The output terminal of the upper module 105, i.e. the source terminal of the transistor 125, is coupled to the input terminal of the lower module 110, i.e. the drain terminal of the transistor 130, defining a corresponding circuit node U.

The operation of the discharge circuit 100 is now described according to an embodiment by referring to FIG. 1 in conjunction with FIGS. 2A and 2B, which illustrate the trend of the output voltage VCP of the charge pump and the trends of the currents in the discharge circuit 100 during a discharging operation.

During an operation period of the charge pump 102 (EN at VDD) the signals EN and ENL are set to the ground voltage. Consequently, the transistor 135 is inactive, thus isolating the discharge circuit 100 from the ground terminal GND, while the transistor 140 is active, so as to force the node U to the supply voltage VDD. In such situation, the voltage difference between the gate terminal and source terminal of the transistor 125 is cancelled (i.e., is approximately zero), and, therefore, such transistor 125 is inactive. The transistor 115b is instead active, as the voltage difference between the source terminal and the gate terminal is equal to VCP-VDD; in this way the transistor 115b provides a voltage approximately equal to the output voltage VCP to the gate terminal of the transistor 115a, which is, therefore, inactive. It is therefore clear that the discharge circuit 100 does not affect in any way the operation of the charge pump when the latter is operating.

When the charge pump is turned off, the voltage of the enable signal EN of the charge pump 102 is brought to the ground voltage value, and, thus, the disabling signal EN is brought to the supply voltage VDD, turning off the transistor 140. At the same time, the enable signal ENL is brought to an intermediate value, e.g. equal to 1.2 V for a supply voltage VDD equal to 3.3 V, which causes operation in the saturation regime (i.e. with approximately constant current) of the transistor 135. In this way, all the transistors 115b, 120, 125, 130, 135 are active, forming a conductive path between the output terminal OCP of the charge pump 102 and the reference terminal GND. An initial discharge current 101 is generated that, through the conductive path defined by transistors 115b, 120, 125, 130, 135, reaches the reference terminal GND. The intensity of such discharge current 101 is determined by the transistor 135. In particular, the discharge current 101 is approximately constant as the transistor 135 operates in the saturation regime. The current 101 discharges the capacitors of the charge pump 102 coupled to the output terminal OCP by linearly reducing over time the output voltage VCP (as shown in FIG. 2A). The discharge current 101 also reduces the voltage of the node C, hereinafter referred to as a control voltage and identified in the figures with the reference VC. When the control voltage VC falls below a voltage value equal to the sum of the values of the supply voltage VDD and of a threshold voltage VTpb of the transistor 115b (i.e. when VC<VDD+VTpb), the latter turns off, thus zeroing the discharge current 101. At the same time, when the control voltage VC reaches such value, the transistor 115a turns on, coupling the output terminal OCP with node B (which is at the supply voltage VDD). In particular, the transistor 115a operates in a triode regime, which is characterized by a resistive behavior. Therefore, a second discharge current 102 flows from the output terminal OCP to the node B through the transistor 115a and further reduces the output voltage VCP until it falls to approximately the value of the supply voltage VDD. In more detail, the discharge current 102 is of the exponentially decreasing type with a characteristic intensity and time constant determined by the capacitors coupled to the output terminal OCP and by the equivalent conduction resistance associated with the transistor 115a. At the end of this phase, the capacitors coupled to the output terminal OCP of the charge pump are approximately fully discharged and the output terminal OCP is at a voltage value approximately equal to the supply voltage VDD.

The transistors 120 and 130 are coupled according to a diode configuration in order to maintain the voltage of the drain terminal of the transistors 125 and 135, respectively, within a safe value such to ensure the proper operation thereof. In particular, the transistor 120 prevents the drain terminal of the transistor 125 from reaching a value greater than or equal to twice the supply voltage VDD, which would impose a voltage between drain and source terminals of the transistor 125 greater than the supply voltage VDD. In such condition the transistor 125 may operate in an inefficient manner and/or be damaged. Similarly, the transistor 130 prevents the drain terminal of the transistor 135 from reaching a value greater than the supply voltage VDD. In other words, the transistors 120 and 130 operate as voltage shifters.

The form factor of the transistor 115b—i.e. the ratio between its channel width and its channel length—may ensure an optimal operation of the discharge circuit 100. In more detail, such form factor defines the conductivity of the transistor 115b. In an embodiment, the conductivity of the transistor 115b is high in order to ensure an operation in the triode regime thereof, thus ensuring that the value of the discharge current 101 is entirely determined by the transistor 135. A reduced conductivity of the transistor 115b might bring the same to operate in saturation, causing a reduction in the value of the control voltage VC. As a consequence of such reduction in the value of the control voltage VC there may be an advanced turning on of the transistor 115a, thus triggering a positive feedback between the transistors pair 115b and 115a, which may lead to a non linear discharge (i.e. with non-constant current), even of considerable intensity, which is potentially capable of damaging components of the charge pump and/or causing electromagnetic interferences which may be harmful for a system wherein the charge pump is integrated.

Looking at FIGS. 2A and 2B, two phases in which the charge pump discharge is divided by the discharge circuit 100 may be clearly distinguished. A first phase is characterized by the discharge current 101, having a constant value that is relatively reduced. During such first phase the output voltage VCP linearly decreases from the value equal to twice the supply voltage VDD to the value VDD+VTpb. A second phase is characterized by the discharge current 102, whose value decreases very rapidly in a non-linear fashion, starting from a value that is much higher (in absolute value) than the current 101 value. During this second phase, the output voltage VCP decreases exponentially from the value VDD+VTpb down to the value of the supply voltage VDD. Through the form factors of the transistors 115b and 115a it may be possible to set the duration of the two discharge phases. In particular, in an embodiment the first phase is set longer than the second phase, since the discharge current 101 provides a greater reliability and a lower effort for the electronic components of both the discharge circuit 100 and the charge pump with a consequent reduction of disadvantageous associated phenomena such as for example, sudden increases in temperature and worsening of the characteristics of electromagnetic-compatibility features of the electronic device in which the circuit is included.

According to a further embodiment, instead of bringing the enable signal ENL to a voltage of value lower than the value of the supply voltage VDD during the activation of the discharge circuit 100, such signal is brought to a voltage approximately equal to the supply voltage VDD. Consequently, the transistor 135 operates in a triode regime (i.e. it has an electrical behavior similar to a resistance). In this way the current 101 is determined by the transistor 125, which operates in the saturation regime (at least until the source terminal is at a voltage higher than the supply voltage VDD minus a threshold voltage VTn of the transistor itself).

Figure 3:
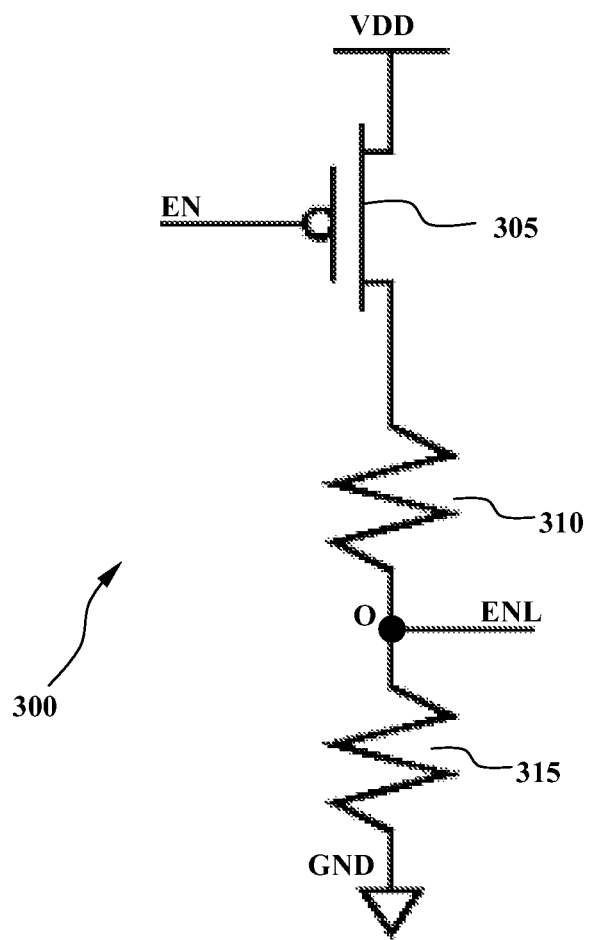
FIG. 3 is a schematic diagram of a biasing circuit for providing an enable voltage to the circuit of FIG. 1 according to an embodiment.

FIG. 3 is a schematic diagram of a bias circuit 300 for generating the enable signal ENL for the circuit of FIG. 1, according to an embodiment. The bias circuit 300 includes a P-channel transistor 305, a first resistor 310 and a second resistor 315. The transistor 305 has a source terminal for receiving the supply voltage VDD, a gate terminal for receiving the pump enable signal EN, and a drain terminal coupled to a first terminal of the first resistor 310. A second terminal of the first resistor 310 is coupled to a first terminal of the second resistor 315 (circuit node O); the second transistor also has a second terminal coupled to the GND terminal to receive the ground reference voltage. The enable signal ENL to be provided to the discharge circuit described above is taken at the node O.

The bias circuit 300 operates as follows. During an activity period of the charge pump the pump enable signal EN has a value corresponding to the supply voltage VDD. Consequently, the transistor 305 is off and the node O is brought to the ground voltage through the second resistor 315. When the charge pump is turned off, the pump enable signal EN has a value corresponding to the ground voltage. The transistor 305 is thus turned on and provides the supply voltage VDD to the first terminal of the first resistor 310. Due to an appropriate sizing and to the resistive partition effect between the resistors 310 and 315, the voltage of the node O is brought to a voltage value equal to a fraction of the supply voltage VDD, so that the transistor 135 of the discharge circuit 100 shown in FIG. 1 operates in saturation regime.

Figure 4:
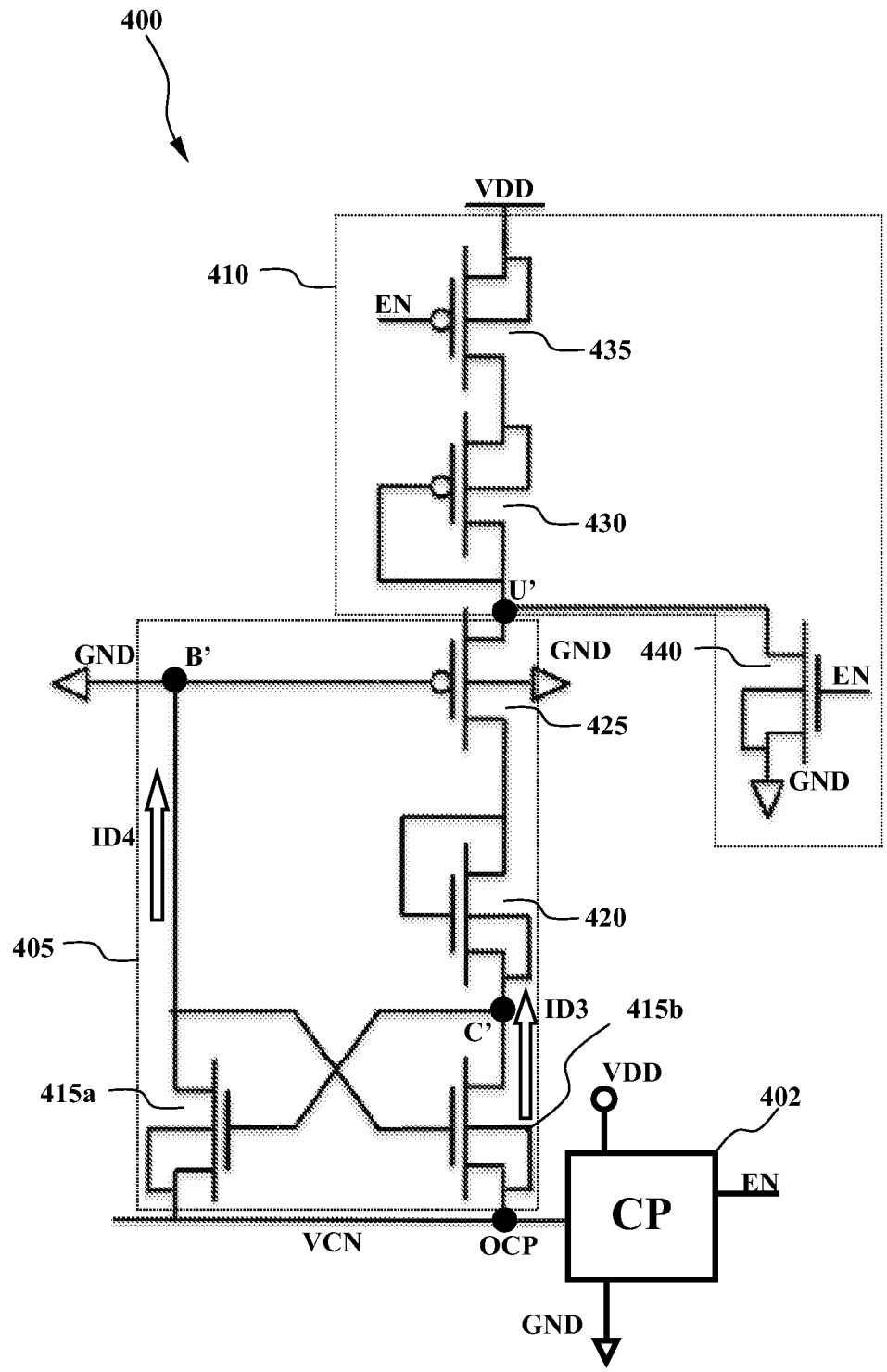
FIG. 4 is a schematic diagram of a discharge circuit for charge pumps that provide negative voltage values, according to a further embodiment.

FIG. 4 is a schematic diagram of a discharge circuit 400 for a charge pump that provides negative voltage values according to an embodiment. In particular, the discharge circuit 400 is adapted to discharge an output terminal of a charge pump 402 adapted to generate a (negative) output voltage VCN starting from a (positive) supply voltage VDD, in particular, the output voltage VCN generated by the charge pump is such to have (in the absence of external loads), a value equal in magnitude but opposite in sign to the value of the supply voltage VDD.

The discharge circuit 400 is substantially a complementary or dual circuit of the discharge circuit 100 of FIG. 1. In particular, the discharge circuit 400 includes a lower module 405 and an upper module 410.

The lower module 405 includes an N-channel transistor 415a with a source terminal coupled to an output terminal OCP of the charge pump that provides the output voltage VCN. A drain terminal of the transistor 415a is coupled to a terminal B' coupled to the ground terminal GND for receiving the ground voltage, while a gate terminal is coupled to a drain terminal of a N-channel transistor 415b (circuit node C'). The transistor 415b has a source terminal coupled to the output terminal OCP and a gate terminal coupled to the terminal B'. The lower module 405 further includes an N-channel transistor 420 having a source terminal coupled to the node C' and a drain terminal and a gate terminal coupled to a drain terminal of a P-channel transistor 425. The transistor 425 has a gate terminal coupled to the terminal B' and a source terminal that serves as output terminal of the lower module 405. Moreover, in order to limit the body effect, the body terminals of the transistors 415a, 415b and 420 are coupled to their respective source terminals, while the body terminal of the transistor 425 is biased with the ground voltage.

The upper module 410 includes a P-channel transistor 435 having a source terminal coupled to a terminal for receiving the supply voltage VDD, a gate terminal for receiving the pump enable signal EN and a drain terminal coupled to the source terminal of a P-channel transistor 430. The transistor 430 has a gate terminal coupled to a drain terminal thereof. In particular, the drain terminal serves as the input terminal of the upper module 410. The upper module also includes an N-channel transistor 440 having a source terminal coupled to the reference terminal GND for receiving the ground voltage, a drain terminal coupled to the drain terminal of the transistor 430 and a gate terminal to receive the pump enable signal EN.

The output terminal of the upper module 410, i.e. the drain terminal of the transistor 430 is coupled to the input terminal of the lower module 405, i.e. the source terminal of the transistor 425, defining a corresponding circuit node U'.

The operation of the discharge circuit 400 according to an embodiment is as follows. When the charge pump 402 is activated, the pump enable signal EN is brought to the supply voltage VDD and the transistor 435 is inactive. In this way, the discharge circuit 400 is isolated from the terminal that receives the supply voltage VDD, while the transistor 440 is turned on, so as to force the node U' to the ground voltage. In this way, the voltage difference between the gate terminal and source terminal of the transistor 425 is cancelled, so that transistor 425 is off. The transistor 415b is turned on and supplies a voltage approximately equal to the output voltage VCN to the gate terminal of the transistor 415a, which is thus turned off. It is evident that the discharge circuit 400 does not in any way affect the operation of the charge pump when the latter is in operation.

When the charge pump is turned off, the pump enable signal EN is brought to the ground voltage, and thus the transistor 435 is turned on, while the transistor 440 is off. In this situation, also the transistor 415b is turned on. Thus, a conductive path between the terminal receiving the supply voltage VDD and the output terminal OCP of the charge pump 402 at the output voltage VCN is formed through the transistors 415b, 420, 425, 430 and 435. In this case, the transistor 435 operates in a triode regime. A discharge current 103 is then generated which, through the conductive path defined by transistors 415b, 420, 425, 430 and 435, reaches the output terminal OCP. The intensity of the discharge current 103 is approximately constant and is determined by the transistor 425, which operates in the saturation regime. The discharge current 103 discharges the capacitors of the charge pump 402 coupled to the output terminal OCP, thus causing the output voltage VCN to linearly increase over time up to a value approximately equal to the ground voltage minus the threshold voltage VTnn of the transistor 415b; in this condition the transistor 415b is turned off, approximately zeroing the discharge current 103. Consequently, the control voltage VC of the node C' reaches a value equal to about the output voltage VCN. Such value of the control voltage VC turns on the transistor 415a. In particular, the transistor 415a—which operates in the triode regime—couples the output terminal OCP to the node B', which is at ground voltage. A discharge current 104 of the exponentially decreasing type is generated and flows from the reference terminal GND to the output terminal OCP through the transistor 415a and further reduces the output voltage VCN down to approximately the value of the ground voltage. At the end of this phase, the capacitors coupled to the output terminal OCP are approximately fully discharged and the output terminal OCP turns out to be approximately equal to the value of the ground voltage.

According to a further embodiment, instead of providing the signal EN to the gate terminal of the transistor 435, during the activation of the discharge circuit 400 it is provided a signal at a voltage value equal to a proper fraction of the supply voltage VDD, such to ensure that transistor 435 operates in the saturation regime. As a result, the discharge current 103 may be determined by transistor 435.

In this case as well, the purpose of the transistors 420 and 430 coupled in a diode configuration is to maintain the voltages of the drain terminals of the transistors 425 and 435, respectively, within a safe value. In particular, the transistor 420 prevents the drain terminal of the transistor 425 from reaching a value lower than the value of the negative supply voltage VDD. Similarly, the transistor 430 prevents the drain terminal of the transistor 435 from reaching a value lower than the ground voltage. Under such conditions the transistors 425 and 435 may operate in an inefficient manner and/or may be damaged.

Figure 5:
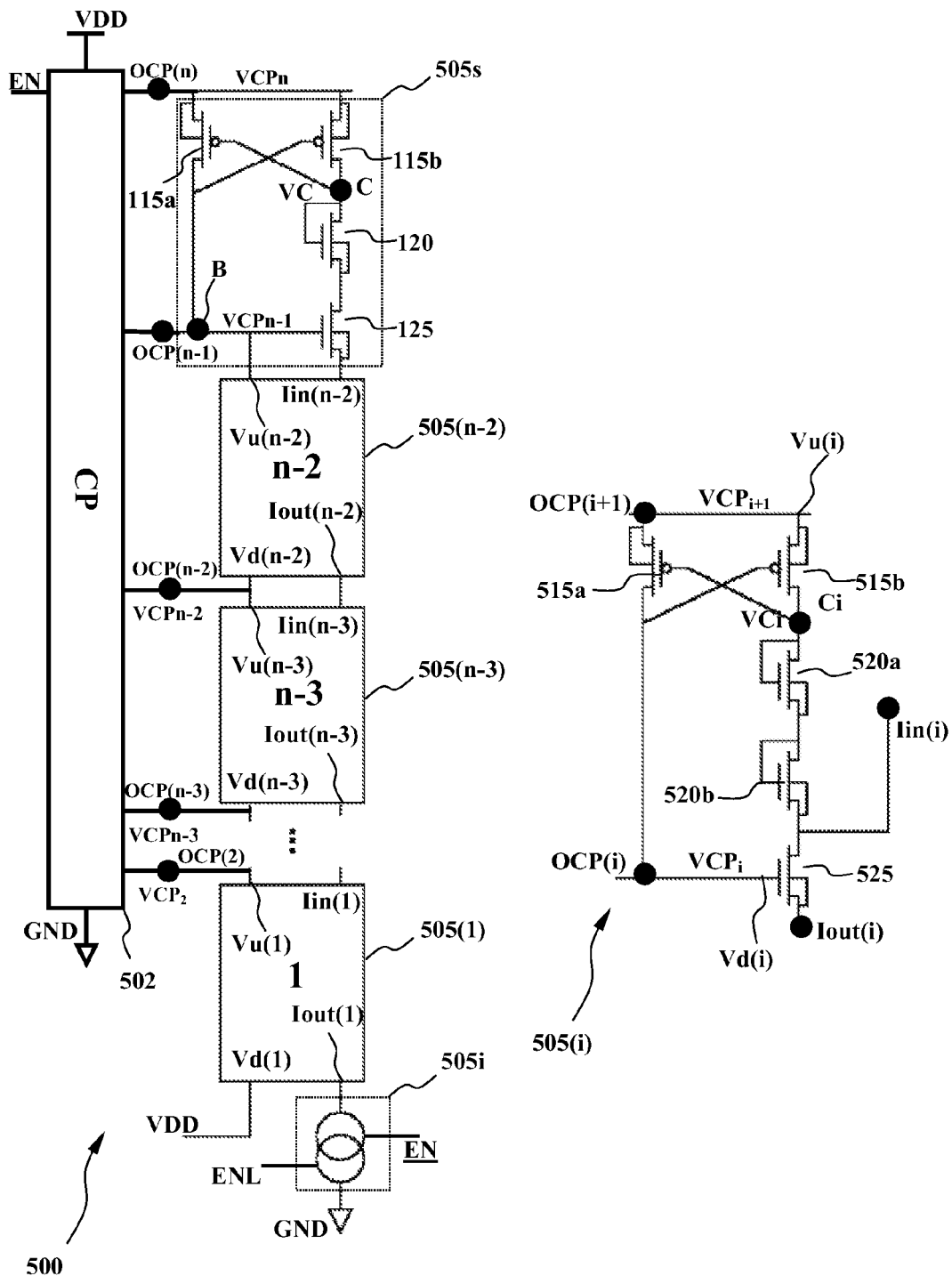
FIG. 5 is a diagram of a discharge circuit according to an embodiment.

According to an embodiment, the discharge circuit 100 described in FIG. 1 may be generalized so that it can operate to discharge the output terminal of a charge pump adapted to generate an output voltage of a value higher than 2*VDD. In particular, FIG. 5 illustrates the circuit schematic of an embodiment of a discharge circuit 500 for the discharge of a charge pump 502 adapted to generate a voltage $VCP_n$ of a value equal to n*VDD (n>1) starting from the power supply voltage VDD. The charge pump 502 includes an output terminal OCP(n) providing the output voltage $VCP_n$, and a plurality of intermediate nodes OCP(i) (i=2, . . . (n−1)); from each intermediate output node OCP(i) it is possible to take a voltage $VCP_i$ of a value equal to i*VDD.

The discharge circuit 500 includes an upper module 505s having a circuit structure equivalent to that of the upper module 105, a lower module 505i having a circuit structure equivalent to that of the lower module 110, and, in the case in which n is greater than two, at least one intermediate module 505(i) (i=1, . . . , (n−2)).

Each intermediate module 505(i) has a first input terminal Vu(i), a second input terminal Iin(i), a first output terminal Vd(i) and a second output terminal Iout(i). The input terminals Vu(i), Iin(i) of the generic intermediate module 505(i) are coupled to the output terminals Vd(i+1), Iout(i+1), respectively, of the following intermediate module 505(i+1). The input terminal Vu(n−2) of the last intermediate module 505 (n−2) is coupled to an output terminal of the upper module 505s equivalent to the terminal B of the upper module 105 (see FIG. 1), while the input terminal Iin(n−2) is coupled to the output terminal of the upper module 505s, equivalent to the output terminal of the upper module 105 (see FIG. 1). The output terminal Vd(i) of the first intermediate module 505(1) is coupled to a terminal that receives the supply voltage VDD, while the output terminal Iout(1) is coupled to an input terminal of the lower module 505i equivalent to the input terminal of the lower module 110 (see FIG. 1). The input terminal Vu(i) of each intermediate module 505(i) is further coupled to the intermediate node OCP(i+1) of the charge pump 502 for receiving the voltage $VCR_{i+1}$.

FIG. 5 illustrates a detailed circuit schematic of the generic intermediate module 505(i) according to an embodiment. In particular, the intermediate module 505(i) includes a P-channel transistor 515a having a source terminal coupled to the input terminal Vu(i)—i.e. the intermediate node OCP(i+1)—a drain terminal coupled the output terminal Vd(i)—i.e. the intermediate node OCP(i)—and a gate terminal coupled to a drain terminal of a P-channel transistor 515b (circuit node Ci). In the case of i=1, the drain terminal of the transistor 515a is coupled to a terminal providing the supply voltage VDD. The transistor 515b further includes a source terminal coupled to the source terminal of the transistor 515a and a gate terminal coupled to the drain terminal of the transistor 515a—and then to the intermediate node OCP(i). The intermediate module 505(i) further includes two voltage shifters 520a and 520b, in particular, a N-channel transistor 520a having a drain terminal and a gate terminal coupled to the node Ci and a source terminal coupled to a drain terminal of a further N-channel transistor 520b. The transistor 520b also has a gate terminal coupled to the drain terminal and a source terminal coupled to a drain terminal of a further N-channel transistor 525. The N-channel transistor 525 also has a gate terminal coupled to the output terminal Vd(i)—and therefore to the intermediate node OCP(i)—and a source terminal that serves as output terminal Iout(i) of the intermediate module 505(i). The input terminal Iin(i) of the intermediate module 505(i) is represented by a circuit node formed by the coupling of the source terminal of the transistor 520b with the drain terminal of the transistor 525.

Figure 6:
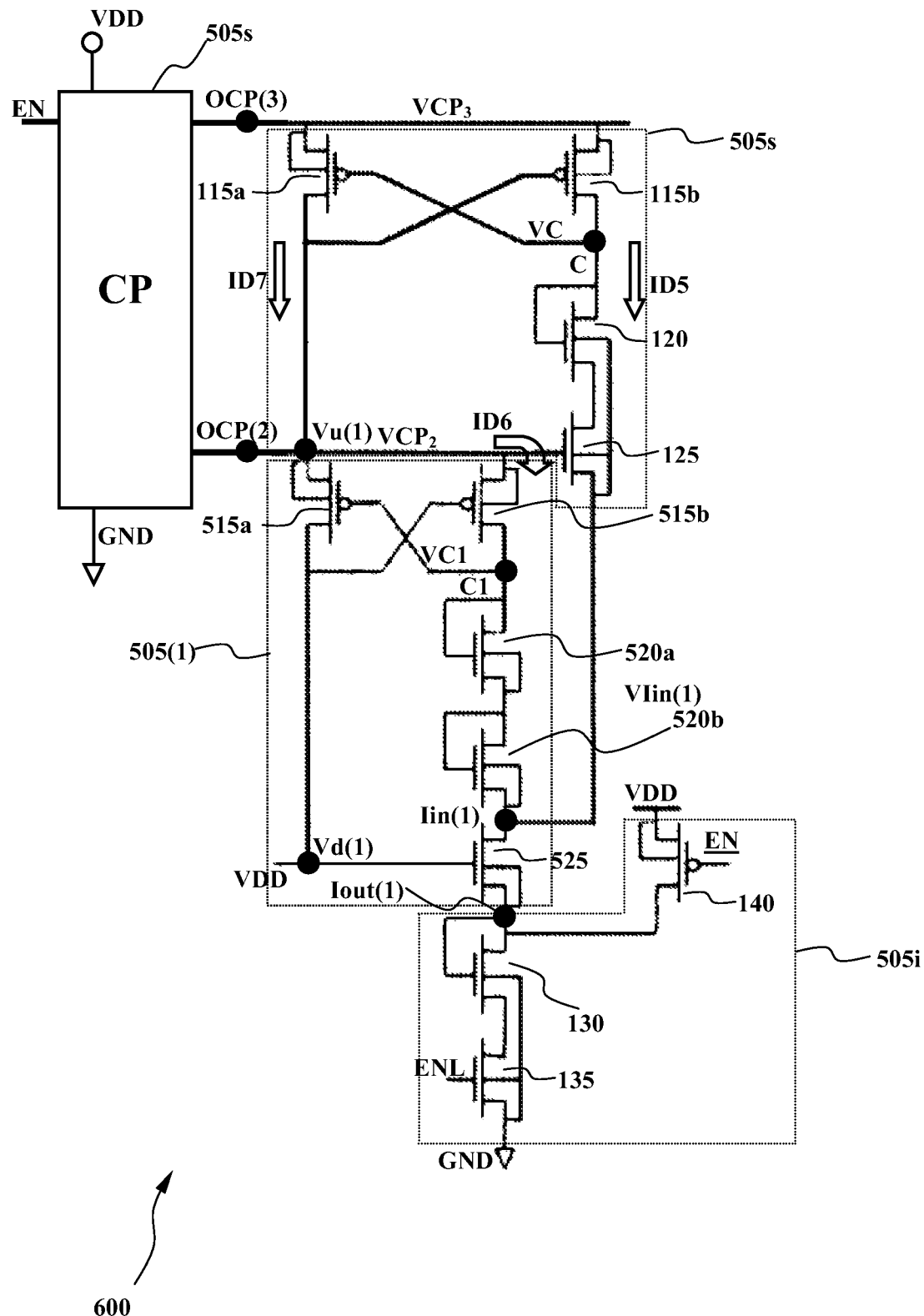
FIG. 6 is a schematic diagram of the modular circuit of FIG. 5 when comprising a single intermediate module according to an embodiment.

In order to exemplify the overall operation of the discharge circuit 500, reference will be made to an embodiment thereof shown in FIG. 6, and identified with the reference 600. In particular, the discharge circuit 600 of FIG. 6 corresponds to the case wherein n=3, i.e. the circuit is adapted to discharge a charge pump 602 adapted to generate a voltage $VCP_3$ equal to 3*VDD starting from the supply voltage VDD.

The discharge circuit 600 includes an upper module 505s, an intermediate module 505(1) and a lower module 505i, coupled to each other as described above in relation with FIG. 5.

The operation of the discharge circuit 600 is as follows according to an embodiment.

During the operation period of the charge pump, the signals EN and ENL are brought to the ground voltage GND; consequently, the transistor 135 is off, thus isolating the discharge circuit 600 from the ground terminal GND, while the transistor 140 is on, thus imposing the supply voltage VDD to the node Iout(1) (and in particular to the source of the transistor 525). In this way the voltage between gate and source of the transistor 525 is approximately null, so that such transistor 525 is turned off. The transistor 515b is instead on, since the voltage between source and gate is approximately equal to the supply voltage VDD value, as the source terminal is at the voltage $VCP_2$ (i.e. at a value equal to twice the value of supply voltage VDD) while the gate terminal is at the supply voltage VDD. Therefore, the transistor 515b provides a voltage approximately equal to $VCP_2$ to the gate terminal of the transistor 515a, which is off because it has approximately a null voltage between the source and drain terminals. The transistor 115b as well is on because the voltage between source and gate is approximately equal to the supply voltage VDD, as the source terminal is at the voltage $VCP_3$ (i.e. at a value equal to three times the value of supply voltage VDD), while the gate terminal is at the supply voltage VDD. Therefore, the transistor 115b provides a voltage approximately equal to $VCP_3$ to the gate terminal of the transistor 115a, which is off because it has approximately a null voltage between the source and drain terminals. It is clear that the discharge circuit 600 does not in any way affect the operation of the charge pump when the latter is active.

When the charge pump is turned off, the voltage value of the enable signal of the charge pump is brought to the ground voltage value; consequently, the disabling signal EN is brought to the supply voltage VDD, turning off the disabling transistor 140. At the same time, the enable signal ENL is brought to the intermediate value to ensure the operation of the transistor 135 in the saturation regime. Consequently, all the transistors 115b, 120, 125, 525, 130 and 135 are turned on, forming a conductive path between the output terminal $OCP_3$ and the ground terminal GND. Then is generated a discharge current 105 of approximately constant value, determined by transistor 135. Moreover, a voltage VIin(1) of the terminal Iin(1) is brought to a voltage approximately equal to the voltage $VCP_2$ minus a threshold voltage VTn (i.e. $VCP_2$−VTn) of the transistor 125. In particular, the voltage VIin(1) does not allow the turning on of the transistors 520b and 520a. The discharge current 105 discharges the capacitors of the charge pump coupled to the output terminal $OCP_3$ by linearly reducing over time the voltage $VCP_3$. The discharge current 105 also reduces the value of the control voltage VC of the node C. When the control voltage VC falls below a voltage value equal to approximately twice the value of the supply voltage VDD plus the threshold voltage VTpb of the transistor 115b (i.e., when VC<2VDD+VTbp) the latter turns off, approximately zeroing the discharge current 105. At the same time, when the control voltage VC reaches this value, the transistor 115a turns on, thus coupling the output terminal $OCP_3$ with the terminal $OCP_2$. As soon as the voltage VIin(1) reaches a voltage value approximately equal to twice the value of the supply voltage VDD minus the threshold voltages VTa and VTb of the transistors the 520a and 520b VIin(1) <2VDD+VTa+VTb), also the transistors 520a and 520b turn on, in this situation the transistors 115a, 515b, 520a, 520b, 525, 130 and 135 thus form a new conductive path between the terminal $OCP_2$ and the ground terminal GND. Then is generated a discharge current ID6 of approximately constant value, determined by the transistor 135. The discharge current ID6, continuing to discharge the capacitors of the charge pump coupled to the output terminal $OCP_3$, begins to discharge also the capacitors of the charge pump coupled to the terminal $OCP_2$. As a result, both the voltage $VCP_3$ and the voltage $VCP_2$ linearly decrease over time. The discharge current 106 also reduces the value of the control voltage VC1 of the node C1. When the control voltage VC1 drops below a voltage value approximately equal to the value of the supply voltage VDD plus the value of the threshold voltage VTpbi of the transistor 515b (i.e. when VC1<VDD+VTpbi) the latter turns off approximately zeroing the discharge current 106. At the same time, when the intermediate control voltage VC1 reaches such value, the transistor 515a turns on (operating in triode regime) coupling the terminal $OCP_2$ and the output terminal $OCP_3$ to the terminal Vd(1). In this condition, the transistor 515a operates in triode regime; a third discharge current 107 is generated, flowing from the terminals $OCP_3$ and $OCP_2$ to the terminal Vd(1) across the transistor 515a, which further reduces the voltages $VCP_3$ and $VCP_2$ down to the value of the supply voltage VDD. This current 107 is of the exponentially decreasing type, having an intensity and a time constant determined by the capacity of the common capacitors at the nodes $OCP_3$ and $OCP_2$.

The transistors 120, 130, 520a and 520b are coupled in a diode configuration in order to maintain the voltage on the drain terminal of the transistors 125 and 135 within a safe value such as to allow for the proper operation thereof. In particular, the transistor 120 prevents the drain terminal of the transistor 125 from reaching a value greater than about three times the supply voltage VDD, which would impose a voltage between drain and source terminals of the transistor 125 greater than the supply voltage VDD. In such condition the transistor 125 may operate in an inefficient manner and/or may be damaged. Similarly, the transistor 130 prevents the drain terminal of the transistor 135 from reaching a value greater than the supply voltage VDD. In this condition the transistor 135 may operate in an inefficient manner and/or may be damaged. The transistors 520a and 520b in addition to preventing the drain terminal of the transistor 525 from reaching a value greater than about twice the supply voltage VDD (which may impose a voltage between drain and source terminals of the transistor 525 greater than the supply voltage VDD and potentially harmful), cause the discharge current 106 to flow only after an approximately complete zeroing of the discharge current 105. This allows the voltage between drain and source terminals of the transistor 115a to remain below approximately the value of the supply voltage VDD (to prevent the transistor from being damaged or from operating in an inefficient manner). In addition, such discharge circuit 600 allows reactivation the charge pump also before the end of a discharge operation thereof, without any risk of damage, having a voltage value equal at the most to the supply voltage VDD among each output node Vd(1), $OCP_2$ and $OCP_3$ in every instant of the operation thereof.

As previously described for the form factor of the transistor 115b, the form factor of the transistor 515b may be made to facilitate an approximately optimal operation of the discharge circuit 600. In more detail, such form factor determines the conductivity of the transistor 515b. The conductivity of the transistor 515b is high for allowing a satisfactory operation in the triode regime thereof thus allowing the value of the discharge current 106 to be determined by the transistor 135. A reduced conductivity of the transistor 515b might cause the same to operate in the saturation regime, causing a reduction in the value of the control voltage VC1. In consequence to such a reduction in the value of the control voltage VC1 there may be an unanticipated turning on of the transistor 515a, thus triggering a positive feedback between the transistors pair 515a and 515b, which may lead to a non-linear discharge (i.e. with a non-constant current), which, although it may be of considerable intensity, it is potentially capable of damaging components of the charge pump and/or causing harmful electromagnetic interference for a system wherein it is integrated.

Figure 7:
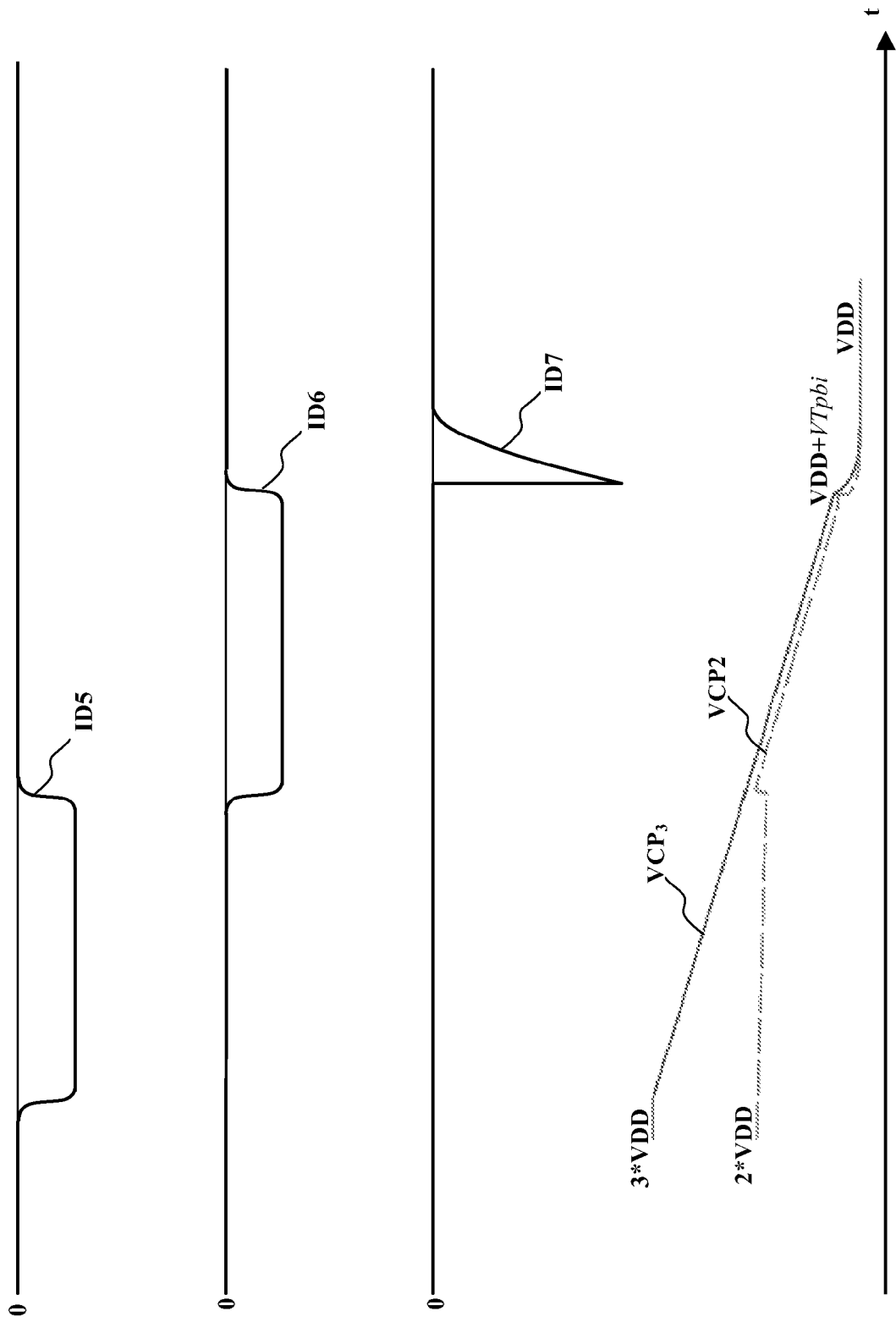
FIG. 7 is a plot of the trend of output voltages of a charge pump when discharged by the discharge circuit of FIG. 6, and of discharge currents of the latter, during an exemplary discharge operation according to an embodiment.

Looking at FIG. 7 the three phases in which is divided the discharge of the charge pump made by the discharge circuit 600 may be clearly distinguished according to an embodiment. A first phase is characterized by the discharge current 105, having an approximately constant value relatively reduced. During such first phase the output voltage $VCP_3$ linearly decreases over time from the value equal to three times the supply voltage VDD to the value 2VDD+VTpb. A second phase is characterized by the discharge current 106, having a relatively contained approximately constant value too. During such second phase the output voltages $VCP_3$ and $VCP_2$ linearly decrease over time from the value approximately equal to twice the supply voltage VDD to the value VDD+VTpbi. A third phase is characterized by the discharge current 107, whose value decreases very rapidly in a non-linear fashion, starting from a much higher value (in absolute value) than the value of the currents 105 and 106. During such second phase the output voltages $VCP_3$ and $VCP_2$ exponentially decrease from the value VDD+VTpbi down to approximately the value of the supply voltage VDD. Through the form factors of the transistors 115a, 115b, 515b and 515a one may set the durations of the three phases of the discharge. In particular, one may set a first and a second phases longer than the third phase, as the discharge currents 105 and 106 may ensure greater reliability and a lower stress for the electronic components of both the discharge circuit 600 and the charge pump compared to the second discharge current 107.

According to a further embodiment, the discharge circuit 600 is also suitable to operate in an alternative way; instead of bringing the enable signal ENL to a voltage of value lower than the value of the supply voltage VDD during the activation of the discharge circuit 600, such signal is brought to a voltage approximately equal to the supply voltage VDD. Consequently, the transistor 135 operates in triode regime (i.e. it has an electrical behavior similar to a resistance). In this way the currents 105 and 106 are determined by the transistor 125, which operates in the saturation regime (at least until its source terminal is at a voltage higher than approximately twice the supply voltage VDD minus a threshold voltage VTn of the transistor itself). Similarly, the current 106 is determined by the transistor 525, which operates in the saturation regime (at least until its source terminal is at a voltage higher than the supply voltage VDD minus a threshold voltage VTn of the transistor itself).

Naturally, in order to satisfy local and specific requirements, one may apply to one or more of the above-described embodiments many logical and/or physical modifications and alterations. More specifically, although one or more embodiments have been described with a certain degree of particularity, it is understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is intended that specific elements and/or method steps described in connection with any embodiment may be incorporated in any other embodiment as a matter of general design choice.

It is apparent that an embodiment might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages. Moreover, the proposed structure may be integrated with other circuits in the same chip, or it may be mounted in intermediate products (such as motherboards) and coupled with one or more other chips (such as a processor). In any case, an integrated circuit (e.g., a programmable/erasable memory device) may be used in complex systems (such as computer or a mobile phone).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
a charge pump configured to generate a discharge current during a discharge phase;
an evacuating circuit coupled to the generator circuit for evacuating the electric charge stored in the charge pump during a corresponding portion of the discharge phase, said evacuating circuit including a first discharge circuit branch and a second discharge circuit branch coupled to the charge pump such that the first discharge branch and the second discharge branch are cross coupled, said evacuating circuit being configured to cause an initial portion of the discharge current through the first discharge circuit branch, during the portion of the discharge phase of the corresponding circuit node, when the pump voltage of the charge pump is higher than a respective threshold, and a subsequent portion of the discharge current through the second discharge circuit branch when the pump voltage of the charge pump is lower than said respective threshold;
wherein the first circuit branch includes a first transistor of a first type of conductivity and a second transistor of a second type of conductivity opposite to the first and is responsive to the subsequent portion of the discharge current from the second circuit branch.

2. A circuit, comprising:
a charge pump configured to generate a discharge current during a discharge phase;
an evacuating circuit coupled to the generator circuit for evacuating the electric charge stored in the charge pump during a corresponding portion of the discharge phase, said evacuating circuit including a first discharge circuit branch and a second discharge circuit branch coupled to the charge pump, said evacuating circuit being configured to cause the discharge current flowing through the first discharge circuit branch, during the portion of the discharge phase of the corresponding circuit node, when the pump voltage of the charge pump is higher than a respective threshold, and through the second discharge circuit branch when the pump voltage of the charge pump is lower than said respective threshold;
wherein the first circuit branch includes a first transistor of a first type of conductivity and a second transistor of a second type of conductivity opposite to the first; and
wherein the charge pump further comprises a plurality of circuit nodes having an ordered sequence from a first circuit node, such that during the operational phase of the charge pump, the pump voltage of each circuit node except the first being greater, in absolute value, than the pump voltage of the previous circuit node in the sequence, the portion of the discharge phase corresponding to each circuit node starting when the pump voltage of the next circuit node in the sequence results to be lower than the respective threshold of said next circuit node.

3. The circuit according to claim 2,
wherein, in each discharge stage:
said first transistor is coupled between the circuit node corresponding to the discharge stage and the second transistor, and said second transistor being further coupled with a corresponding first circuit node and
the second circuit branch includes a third discharge transistor of the first conductivity type coupled between the circuit node corresponding to the discharge stage and the corresponding first circuit node.

4. The circuit according to claim 3, wherein:
in each discharge stage except the first, said corresponding first circuit node is the circuit node corresponding to the previous discharge stage, and
in the first discharge stage, said corresponding first circuit node is a reference node configured to provide a reference voltage.

5. The circuit according to claim 3, wherein in each discharge stage:
the first transistor has a first conduction terminal coupled to the circuit node corresponding to the discharge stage, a second conduction terminal coupled to a first conduction terminal of the second transistor, and a control terminal coupled to the corresponding first circuit node;
the second transistor has a control terminal coupled to the corresponding first circuit node, and
the third transistor has a first conduction terminal coupled to the circuit node corresponding to the discharge stage, a second conduction terminal coupled to the corresponding first circuit node and a control terminal coupled to the second conduction terminal of the first transistor.

6. The circuit of claim 5, wherein each discharge stage further includes at least one voltage shifter coupled between the second conduction terminal of the first transistor and the first conduction terminal of the second transistor.

7. The circuit of claim 5, wherein:
in each discharge stage except the first, the second transistor has a second conduction terminal coupled to the first conduction terminal of the second transistor of the previous discharge stage, and in the first discharge stage, the second transistor has a second conduction terminal coupled to the charge pump.

8. The circuit of claim 7, wherein the charge pump includes:
a controlled current generator adapted to generate the discharge current during the discharge phase, and
an enabling element configured to turn off the second transistor of the first discharge stage during the operational phase of the charge pump and turning on such second transistor of the first discharge stage during the discharge phase.

9. A method, comprising:
generating a discharge current during a discharge phase having portions;
evacuating accumulated electric charge in a charge pump during a corresponding portion of the discharge phase, said evacuating during each portion of the discharge phase including:
causing an initial portion of the discharge current to flow through a first discharge circuit branch having at least two transistors of opposite conductivity, such that during the portion of the discharge phase, when the voltage of a corresponding control node is higher than a respective threshold, and
causing a subsequent potion of the discharge current to flow through a second discharge circuit branch that is cross coupled to the first discharge branch when the voltage of the corresponding control node is lower than said respective threshold and in response to the second discharge current from the discharge circuit.

10. A discharger, comprising:
an input node;
first and second intermediate nodes;
a first branch having at least one transistor and having at least one diode, the first branch coupled between the input node and first intermediate node and configured to conduct a first discharge current during a first portion of a discharge period; and
a second branch cross-coupled with the first branch and coupled between the input node and second intermediate node and configured to conduct a second discharge current during a second portion of the discharge period;
wherein the at least one transistor in the first branch is coupled to the second branch and the at least one transistor in the second branch is coupled to the first branch.

11. The discharger of claim 10 wherein the first discharge current includes an approximately constant current.

12. The discharger of claim 10 wherein the second discharge current includes a non-constant current.

13. The discharger of claim 10 wherein the first branch includes a current source.

14. The discharger of claim 10 wherein the second branch includes a first transistor having a first conduction node coupled to the input node, a second conduction node coupled to the second intermediate node, and a control node coupled to the first branch.

15. The discharger of claim 10, further comprising:
a reference node; and
a current source coupled between the first intermediate node and the reference node.

16. The discharger of claim 10, further comprising:
a reference node;
a diode having a first node coupled to the first intermediate node and having a second node; and
a current source coupled between the second node of the diode and the reference node.

17. A discharger, comprising:
an input node;
first and second intermediate nodes;
a first branch having at least one transistor and having at least one diode, the first branch coupled between the input node and first intermediate node and configured to conduct a first discharge current during a first portion of a discharge period; and
a second branch coupled between the input node and second intermediate node and configured to conduct a second discharge current during a second portion of the discharge period;
wherein the first branch includes:
a first transistor of a first type having a first conduction node coupled to the input node, a second conduction node, and a control node coupled to the second intermediate node;
a diode having a first node coupled to the second conduction node of the first transistor and having a second node; and
a second transistor of a second type having a first conduction node coupled to the second node of the diode, a second conduction node coupled to the first intermediate node, and a control node coupled to the second intermediate node.

18. A discharger, comprising:
an input node;
first and second intermediate nodes;
a first branch having at least one transistor and having at least one diode, the first branch coupled between the input node and first intermediate node and configured to conduct a first discharge current during a first portion of a discharge period; and
a second branch coupled between the input node and second intermediate node and configured to conduct a second discharge current during a second portion of the discharge period;
wherein the first branch includes:
a first transistor of a first type having a first conduction node coupled to the input node, a second conduction node, and a control node coupled to the second branch;
a diode having a first node coupled to the second conduction node of the first transistor and having a second node; and
a second transistor of a second type having a first conduction node coupled to the second node of the diode, a second conduction node coupled to the first intermediate node, and a control node coupled to the second branch.

19. A discharger, comprising:
an input node;
first and second intermediate nodes;
a first branch having at least one transistor and having at least one diode, the first branch coupled between the input node and first intermediate node and configured to conduct a first discharge current during a first portion of a discharge period; and
a second branch coupled between the input node and second intermediate node and configured to conduct a second discharge current during a second portion of the discharge period;
wherein the first branch includes:
a first transistor of a first type having a first conduction node coupled to the input node, a second conduction node, and a control node coupled to the second intermediate node;

a first diode having a first node coupled to the second conduction node of the first transistor and having a second node;

a second diode having a first node coupled to the second node of the first diode and having a second node; and a second transistor of a second type having a first conduction node coupled to the second node of the second diode, a second conduction node coupled to the first intermediate node, and a control node coupled to the second intermediate node.

20. A discharger, comprising:

an input node;

first and second intermediate nodes;

a first branch having at least one transistor and having at least one diode, the first branch coupled between the input node and first intermediate node and configured to conduct a first discharge current during a first portion of a discharge period; and a second branch coupled between the input node and second intermediate node and configured to conduct a second discharge current during a second portion of the discharge period;

the discharger further comprising:

a third intermediate node; and wherein the first branch includes a first transistor of a first type having a first conduction node coupled to the input node, a second conduction node, and a control node coupled to the second intermediate node;

a diode having a first node coupled to the second conduction node of the first transistor and having a second node;

a second transistor of a second type having a first conduction node coupled to the second node of the diode, a second conduction node, and a control node coupled to the second intermediate node; and a third transistor of the second type having a first conduction node coupled to the second conduction node of the second transistor, a second conduction node coupled to the first intermediate node, and a control node coupled to the third intermediate node.

21. An integrated circuit, comprising:

a charge pump having a first pump output node; and a discharger, including a discharger input node coupled to the pump output node;

first and second discharger intermediate nodes;

a first branch having at least one transistor and having at least one diode, the first branch coupled between the discharger input node and first discharger intermediate node and configured to conduct a first discharge current during a first portion of a discharge period; and a second branch cross-coupled with the first branch and coupled between the discharger input node and second discharger intermediate node and configured to conduct a second discharge current during a second portion of the discharge period;

wherein the at least one transistor in the first branch is coupled to the second branch and the at least one transistor in the second branch is coupled to the first branch.

22. The integrated circuit of claim 21 wherein:

the charge pump has a pump input node; and the second discharger intermediate node is coupled to the pump input node.

23. The integrated circuit of claim 21 wherein:

the charge pump has a second pump output node; and the second discharger intermediate node is coupled to the second pump output node.

24. A system, comprising:

a first integrated circuit, including a charge pump having a first pump output node; and a discharger, including a discharger input node coupled to the pump output node;

first and second discharger intermediate nodes;

a first branch having at least one transistor and having at least one diode, the first branch coupled between the discharger input node and first discharger intermediate node and configured to conduct a first discharge current during a first portion of a discharge period; and a second branch cross-coupled with the first branch and coupled between the discharger input node and second discharger intermediate node and configured to conduct a second discharge current during a second portion of the discharge period;

wherein the at least one transistor in the first branch is coupled to the second branch and the at least one transistor in the second branch is coupled to the first branch; and a second integrated circuit coupled to the first integrated circuit.

25. The system of claim 24 wherein the first and second integrated circuits are disposed on a same die.

26. The system of claim 24 wherein the first and second integrated circuits are disposed on respective dies.

27. The system of claim 24 wherein one of the first and second integrated circuits includes a controller.

28. The system of claim 24 wherein one of the first and second integrated circuits includes a memory.

29. A method, comprising:

partially discharging a charge pump at a first rate through a first portion of a circuit; and discharging the charge pump at a second rate through a second portion of the circuit cross-coupled to the first portion after partially discharging the charge pump at the first rate and in response to a signal from the first portion.

30. The method of claim 29 wherein the first rate is approximately constant.

31. The method of claim 29 wherein the second rate is varying.

32. The method of claim 29 wherein partially discharging the charge pump at the first rate causes a pump voltage to decay approximately linearly.

33. The method of claim 29 wherein discharging the charge pump at the second rate causes a pump voltage to decay approximately exponentially.

34. The method of claim 29 wherein discharging the charge pump at the second rate includes fully discharging the charge pump.

35. The method of claim 29, further including activating the charge pump after partially discharging the charge pump at the first rate but before discharging the charge pump at the second rate.

36. The method of claim 29, further including activating the charge pump after starting to discharge the charge pump at the second rate but before fully discharging the charge pump.

37. The method of claim 29 wherein partially discharging the charge pump includes partially discharging the charge pump from a single output node.

38. The method of claim 29 wherein partially discharging the charge pump includes partially discharging the charge pump from multiple output nodes.

39. A method, comprising:

partially discharging a charge pump at a first rate;

discharging the charge pump at a second rate after partially discharging the charge pump at the first rate; and inactivating the charge pump before discharging the charge pump at the first and second rates.

* * * * *